May 29, 1951 K. SCHLESINGER 2,554,924

SAWTOOTH CURRENT GENERATOR

Filed Sept. 16, 1947 2 Sheets-Sheet 1

INVENTOR.
Kurt Schlesinger
BY Foorman L. Mueller
Atty.

INVENTOR.
Kurt Schlesinger
BY Foorman L. Mueller
Atty.

Patented May 29, 1951

2,554,924

UNITED STATES PATENT OFFICE 2,554,924

SAWTOOTH CURRENT GENERATOR

Kurt Schlesinger, Maywood, Ill., assignor to Motorola, Inc., Chicago, Ill., a corporation of Illinois Application September 16, 1947, Serial No. 774,371

11 Claims. (Cl. 250—36)

This invention relates generally to sawtooth oscillators and in particular to an oscillator adapted for use as a sawtooth current generator for provided scanning current in a television system.

In the prior art many attempts have been made to provide an oscillator which will produce sawtooth currents in the scanning or deflection coils of a television system. In this application as well as in other applications it is desired that the sawtooth wave include a linear trace and a very rapid retrace. It is also desired that the oscillator be capable of being held in step by synchronization pulses which may be of relatively small amplitude. Still further, it is desired that the oscillator be simple in construction, stable in operation, and efficient so that a relatively small amount of power is required to provide the required current output.

Prior systems which have been acceptable, that is, which have produced linear current rise of the required amplitude have been relatively complicated and require a plurality of tubes. For example, oscillators which have been acceptable for use as either horizontal or vertical deflection generators for television receivers have included a minimum of three tubes and many such systems have required four or more tubes. This, of course, results in a system which is initially relatively expensive, which requires considerable maintenance and adjustment due to the large number of components, and which tends to be inefficient due to the losses occurring in the components.

It is, therefore, an object of the present invention to provide an improved oscillator for producing sawtooth currents which is of simple and inexpensive construction.

A further object of this invention is the provision of an improved oscillator for producing self-sustained current oscillations of sawtooth wave form and which can be controlled by synchronization pulses of small amplitude.

A feature of this invention is the provision of a sawtooth oscillator including a condenser across which a sawtooth voltage wave is produced and a discharge valve excited thereby for producing a sawtooth current output, with the output of the valve being coupled to means for discharging the condenser to thereby provide sustained oscillations.

A further feature of this invention is the provision of an oscillator adapted to be used as a sawtooth current generator in a television system in which the voltage surge in the coils at the end of the trace is used to trigger the oscillator and provide the retrace portion of the cycle.

A still further feature of this invention is the provision of a sawtooth current generator which requires only a single tube including a pentode output section and a triode discharge section.

Further objects, features and advantages will be apparent from a consideration of the following description taken in connection with the accompanying drawings in which.

In practicing the invention there is provided an oscillator including an electron discharge valve having the input electrodes thereof connected across a condenser and the output electrodes connected to the coils in which a sawtooth current wave is developed. A circuit is provided for charging the condenser so that the voltage builds up linearly thereacross producing an output current in the discharge valve which builds up linearly. Means are provided for suddenly discharging the condenser to provide the retrace in the current wave. The discharging means are coupled to the output circuit of the valve so that the voltage pulse caused by the decrease in the current rise in the output circuit triggers the discharging means. The discharging means may include a triode bridging the condenser and connected to a coil inductively coupled to the output circuit so that the voltage pulse in the load circuit causes the triode to conduct and discharge the condenser.

Figure 1:
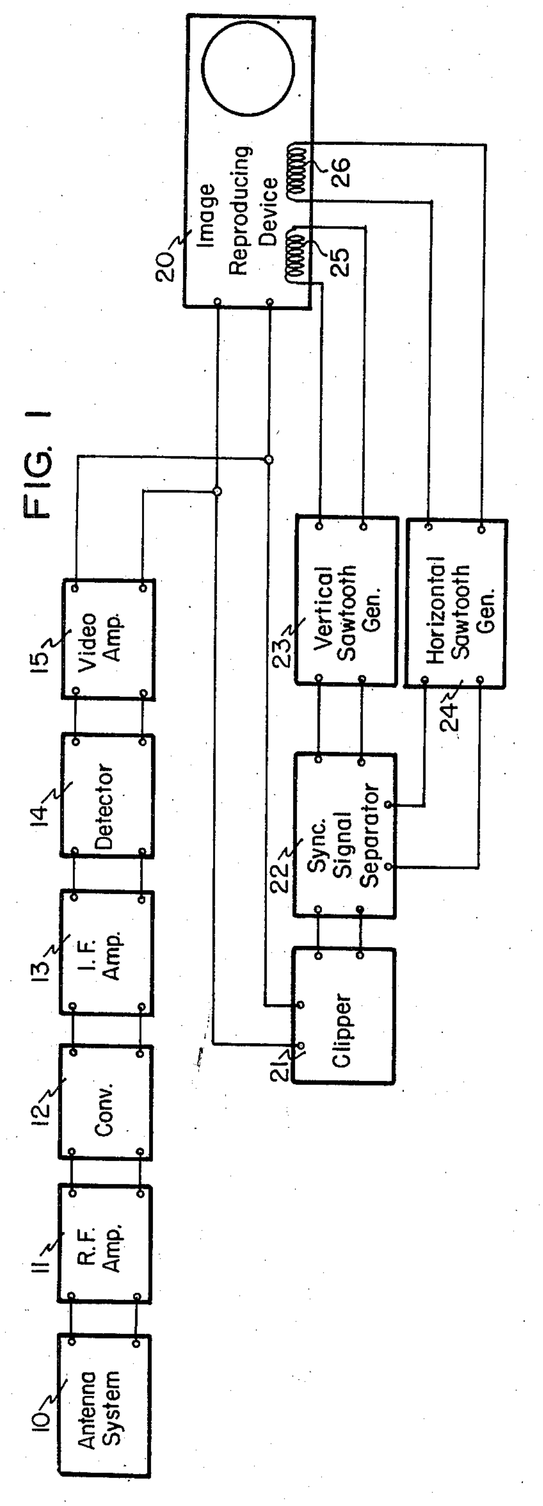
Fig. 1 illustrates a television receiver in which the oscillator in accordance with the invention may be used.

Referring now particularly to the drawings, in Fig. 1 there is illustrated a television receiver system in which the sawtooth current oscillator in accordance with the invention is particularly applicable. The receiver includes an antenna system 10 for intercepting radio frequency signals and applying them to radio frequency amplifier 11 wherein they are selectively amplified. The radio frequency signals are then converted into intermediate frequency signals by converter 12 and applied to intermediate frequency amplifier 13. The video signals are selected and amplified in the intermediate frequency amplifier 13 and applied to detector 14 wherein the video signals are derived from the intermediate frequency wave. The resulting composite video signals are applied to video amplifier 15 wherein they are amplified and applied to image reproducing device 20 and clipper 21. An audio system may also be provided in the television system but as the invention does not relate thereto and as such systems are well known, the audio system is not illustrated.

The image reproducing device 20 includes means for producing a stream of electrons and control means for varying the intensity of the beam. The video signal is applied to these control means so that the intenstiy of the beam is controlled in accordance with the instantaneous amplitude of the video signal. For deriving synchronization signals from the composite video signal, the clipper 21 is provided which applies the synchronization signals to the synchronization signal separator 22 wherein the vertical or field synchronization signals are separated from the horizontal or line synchronization signals. The vertical and horizontal synchronization signals are applied respectively to vertical and horizontal sawtooth generators 23 and 24 which provide sawtooth currents in deflecting coils 25 and 26, respectively, of the image reproducing device 20. The vertical and horizontal sawtooth generators are controlled by the synchronization pulses so that the deflection of the beam produced by the coils 25 and 26 is synchronized with the scanning beam at the television transmitter.

Figure 2:
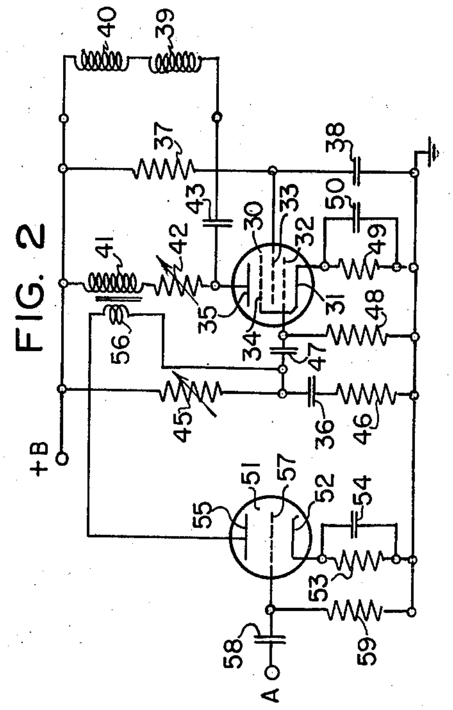
Fig. 2 is a circuit diagram of one form in which the invention may be embodied.

In Fig. 2 there is illustrated an oscillator in accordance with the invention which is adaptable for use either as the vertical or horizontal sawtooth generator of the system in Fig. 1 as will be more fully explained. It is to be pointed out, however, that the oscillator is not limited to such use but is suitable for providing a sawtooth current wave for use in any system. The oscillator includes an electron discharge valve 30 which is illustrated as a pentode including a cathode 31, control grid 32, screen grid 33, suppressor grid 34 and plate 35. The cathode 31 and control grid 32 are connected to an input circuit which includes condenser 36 across which a sawtooth voltage wave is generated as will be more fully explained. The screen grid 33 is connected to a source of potential marked plus B through resistor 37 and is by-passed by condenser 38. The plate 35 is connected to an output circuit including coils 39 and 40 in which a sawtooth current wave is developed. The plate circuit also includes a high impedance choke 41 connected in series with variable resistor 42 between the plate 35 and a source of potential plus B. A blocking condenser 43 is provided in series with the coils 39 and 40.

Referring now more particularly to the means for charging condenser 36, the condenser is illustrated as connected in series with resistors 45 and 46 across the potential source plus B. The condenser is, therefore, charged from this source with the rate being determined by the values of the resistors 45 and 46. Resistor 45 is illustrated as being variable so that the charging rate can be controlled. The voltage developed by condenser 36 is applied to the grid 32 through coupling condenser 47 with the grid 32 being biased by resistor 48. The cathode 31 of tube 30 is also biased as by resistor 49 which is by-passed by condenser 50. Means are provided for discharging the condenser 36, such means being illustrated as an electron discharge valve 51 of the triode type. The triode 51 includes a cathode 52 biased by resistor 53 which is by-passed by condenser 54. The plate 55 of the tube is connected through winding 56 to the condenser 36 so that when the tube 51 conducts the condenser 36 is in effect shorted. For controlling the discharge of the tube 51, a grid 57 is provided which may be connected to a source of synchronization pulses marked A through coupling condenser 58. A biasing resistor 59 is provided for the grid. It is, therefore, seen that when a pulse is applied to the grid 57, and the tube 51 conducts, the condenser 36 is shorted, and when the tube 51 is not conducting the condenser 36 charges through resistors 45 and 46.

Figure 3:
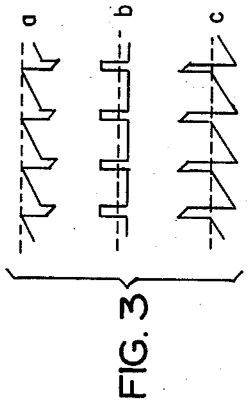
Fig. 3 is a chart showing voltage waves at various points in the oscillator.

To provide sustained oscillations in the circuit without the provision of synchronization pulses, the winding 56 in the plate circuit of tube 51 is inductively coupled to the winding 41 in the output circuit of the tube 30. It is well known that as long as the voltage on the grid 32 of the tube 30 rises and the current in the plate circuit thereof rises at the same rate, the voltage on the plate 35 will remain substantially constant. However, if the voltage on the grid ceases to rise, the plate current cannot continue without an increase in plate voltage. As the plate circuit of the tube 30 includes large inductance in the coils 39, 40 and 41, the current therein cannot stop suddenly and, therefore, will continue and cause the plate voltage to rise rapidly providing a high voltage pulse. This condition will occur in the system illustrated when the voltage on condenser 36 approaches the zero bias value. This voltage pulse is transferred from winding 41 to winding 56 through the inductive coupling. This pulse will increase the voltage on the plate 55 of the triode 51 causing the tube to conduct and condenser 36 to be shorted. Therefore, a sudden drop (retrace) will occur in the current wave while the tube 51 conducts. After the pulse is passed, the tube 51 is again blocked and the condenser 36 will again charge so that the current will again build up in the output circuit of the tube 30. In Fig. 3, curve *a* illustrates the voltage wave on grid 32 caused by the condenser 36. Curve *b* illustrates the voltage wave on plate 35 and shows the pulses produced when the current stops. Curve *c* illustrates the voltage applied to the plate 55 of tube 51 being in effect a superimposition of the voltage in the plate circuit of tube 30 on the voltage applied to the grid 32 thereof.

In the operation of the oscillator, the resistor 45 may be varied to thereby change the current through condenser 36. This will, of course, change the rate of charge of the condenser 36. By making the resistors 45 and 46 large the current will be substantially independent of the voltage across condenser 36 and, therefore, the voltage across the condenser will build up at a uniform rate. This provides a linear trace in the voltage wave which will result in a linear trace in the current wave produced in the coils 39 and 40. The amplitude to which the current in the output circuit of the tube 30 will rise will depend upon the voltage applied to the plate 35 of the tube. This can be controlled by variable resistor 42. Therefore, it is seen that the speed of oscillations and the amplitude of the output current wave are substantially independent and can be independently controlled thereby providing an oscillator which is flexible and may be used in many applications.

Figure 4:
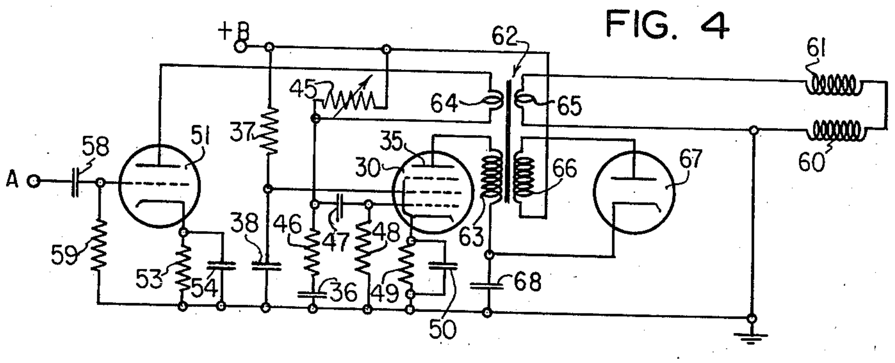
Fig. 4 illustrates an oscillator particularly adaptable for use as the horizontal scanning generator in a television system as illustrated in Fig. 1.

Fig. 4 illustrates a modified oscillator which is particularly adaptable for use as the horizontal scanning generator in a television receiver. The tubes 30 and 51 may be identical to the corresponding tubes in Fig. 2 and are used in the same manner and, therefore, will not be described in detail. The windings 60 and 61 in which sawtooth currents are developed, instead of being directly connected to the plate of tube 30, are coupled to a transformer 62 which includes a plurality of windings 63 to 66, inclusive. The winding 63 is connected in the output circuit of the tube 30 and may be considered the primary winding of the transformer. Winding 64 is coupled in the plate circuit of tube 51 to provide the pulse voltage for energizing tube 51 to cause sustained oscillations. Secondary winding 65 is coupled to the coils 60 and 61 which form the load, and winding 66 is connected to a diode 67 which functions to boost the voltage on the plate 35 of the tube 30. The boosting effect of the diode 67 results as it provides a path for the flow of energy stored in the transformer 62 and loads 60 and 61 due to the current which builds up therein during the trace portion of the cycle. During the retrace portion of the cycle this energy may flow through the diode 67 to charge condenser 68 thereby providing a voltage across the condenser 68. This voltage serves to supplement the voltage applied from the plus B power supply.

Figure 5:
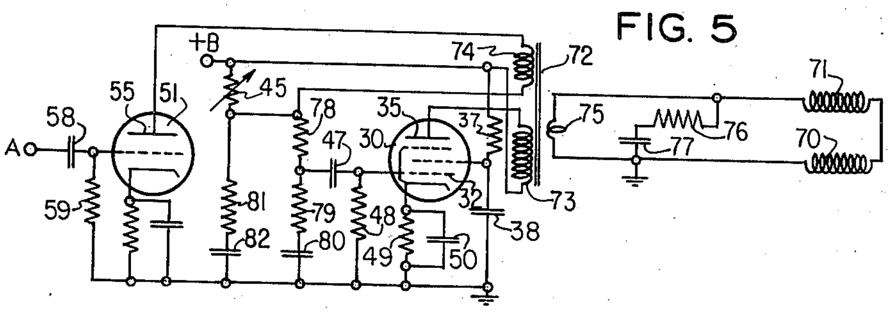
Figs. 5, 6 and 7 illustrate oscillator circuits particularly adaptable for use as the vertical scanning generator of television systems.

In Fig. 5 there is illustrated a further embodiment of the invention with the circuit shown being particularly adaptable for use as a vertical scanning generator in a television receiver. The deflecting coils 70 and 71 are connected through a transformer 72 similar to Fig. 4 with the transformer including windings 73, 74 and 75 which are connected to the plate 35 of the output tube, the plate 55 of the diode 51, and the deflecting coils, respectively. Resistor 76 and condenser 77 are connected in series across the windings 75 as a damping circuit to smooth the overshoot in the deflecting coils. In order to provide proper spacing of the lines in the television picture, it is necessary that the sawtooth waves from the oscillator be linear and, therefore, a circuit is provided to improve the linearity. This circuit comprises resistors 78 and 79 and condenser 80 which are connected in parallel with resistor 81 and condenser 82. The condensers 80 and 82 are charged through the variable resistor 45 in the manner previously described. However, only the voltage across resistor 78 and condenser 80 is applied through coupling condenser 47 to the grid 32 of the tube 30. This circuit corrects for the distortion at low frequencies due to the transformer with the result that the current in the deflecting coils builds up linearly as required.

Figure 6:
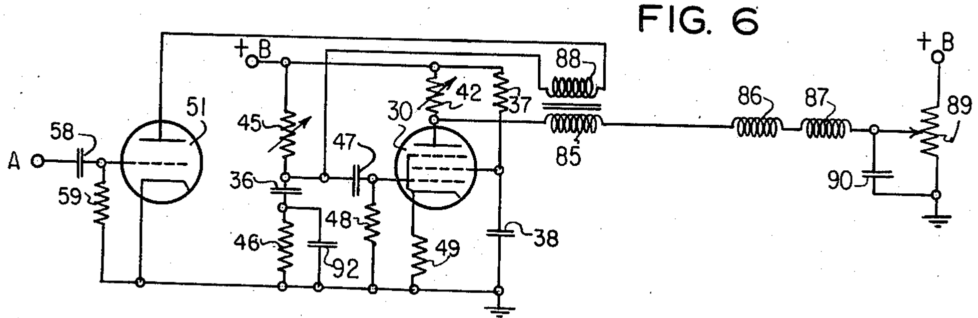
Figure 7:
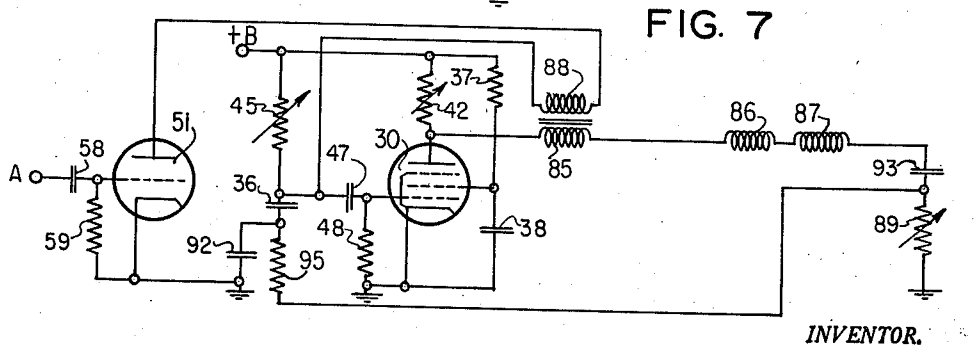

Figs. 6 and 7 show alternative circuits which have been found satisfactory for use as vertical scanning generators. The circuit of Fig. 6 is generally similar to the circuit of Fig. 2 except that the choke coil 85 is placed in series with the deflecting coils 86 and 87. The coil 85 is inductively coupled to coil 88 in the output circuit of the tube 51 to trigger the tube in the same manner as in Fig. 2. The series circuit including the windings 86 and 87 terminates in a variable resistor 89, by-passed by condenser 90, which provides the required potential for centering the picture when the coils 86 and 87 are used as vertical deflecting coils in a television receiver. The circuit of Fig. 7 is generally similar to the circuit of Fig. 6 with the exception that in Fig. 7 the cathodes of both tubes 30 and 51 are connected directly to ground. This permits combining the pentode 30 and the triode 51 in the same envelope and, therefore, allows the use of a single tube such as type 6AD7. This requires the inclusion of resistor 95 in the plate circuit of tube 30 so that the coils 85, 86 and 87 are not shorted directly across the output circuit of the tube. The function of the circuit is identical to that of the prior circuits described and, therefore, need not be described in detail.

It is seen from the above that there is provided an oscillator for producing a current wave of sawtooth wave form which is suitable for general use and is particularly adapted for use as a scanning generator in a television system. Oscillators in accordance with the invention are relatively simple requiring only two tubes and yet are very flexible in operation to meet various requirements. It is to be noted that the two discharge valves may be combined in a single envelope resulting in a great saving of space on the chassis on which the oscillator is mounted. Oscillators in accordance with the invention are adaptable to be used with a booster circuit for increasing the plate voltage on the output tube. This reduces the power required for obtaining a given output from the oscillator resulting in increased efficiency.

Although I have described certain embodiments of my invention which illustrate the same, it is apparent that various changes and modifications can be made therein without departing from the intended scope of the invention as defined in the appended claims.

I claim:

1. An oscillator for providing current of sawtooth wave form comprising, an electron discharge valve having input and output electrodes, a transformer having primary and secondary windings, an output circuit coupled to said electron discharge valve including said primary winding which is connected in series with said output electrodes, a condenser, means for charging said condenser including a source of potential and a resistor connected in series with said condenser across said source of potential so that the voltage across said condenser builds up linearly, circuit means connecting said condenser across said input electrodes of said valve for applying the voltage across said condenser thereto, a second electron discharge valve including input and output electrodes, said output electrodes of said second electron discharge valve being connected in series with said secondary winding across said condenser for discharging the same so that a sawtooth voltage wave is applied to said input electrodes, and means for applying pulses to said input electrodes of said electron discharge valve for rendering said valve conducting.

2. An oscillator for providing current of sawtooth wave form having trace and retrace portions in an inductive load comprising, an electron discharge valve having input and output electrodes, a transformer having primary and secondary windings, an output circuit including said primary winding connecting said load to said output electrodes, a condenser, circuit means connecting said condenser across said input electrodes, means for producing a sawtooth voltage wave across said condensers including means for charging said condenser to produce said trace portion, and means including a second electron discharge valve having output electrodes connected in series with said secondary winding across said condenser for intermittently discharging said condenser for producing said retrace portion so that a sawtooth voltage wave is applied to said input electrodes and the output current of said valve is of sawtooth wave form, and means associated with said condenser for altering the sawtooth wave produced thereacross so that the output current wave has a linear trace.

3. An oscillator for providing current of sawtooth wave form in an inductive load comprising an electron discharge valve having input and output electrodes, a transformer having a primary winding and a plurality of secondary windings, said primary winding being connected in series with said output electrodes, a condenser, circuit means connecting said condenser across said input electrodes, means for charging said condenser so that the voltage builds up linearly thereacross, means providing operating potential to said discharge valve so that the output current thereof corresponds to said input voltage, means including a second electron discharge valve having output electrodes connected in series with one of said secondary windings across said condenser for discharging said condenser when said current in said output circuit reaches a predetermined value so that a sawtooth voltage wave is applied to said input electrodes and the output current of said valve is of sawtooth wave form, another one of said secondary windings being connected to said load for applying said sawtooth current wave thereto.

4. An oscillator for providing current of sawtooth wave form in an inductive load comprising an electron discharge valve having input and output electrodes, a transformer having a primary winding and a plurality of secondary windings, said primary winding being connected in series with said output electrodes, a condenser, circuit means connecting said condenser across said input electrodes, means for charging said condenser including a source of potential and a resistor connected in series with said condenser across said source of potential so that the voltage across said condenser builds up linearly, and a second electron discharge valve having discharge electrodes connected in series with one of said secondary windings across said condenser for discharging the same when the current in said transformer reaches a predetermined value so that a sawtooth voltage wave is applied to said input electrodes and the current in said output electrodes is of sawtooth wave form, one of said secondary windings being connected to said load to apply said sawtooth current wave thereto.

5. An oscillator for providing current of sawtooth wave form in an inductive load comprising an electron discharge valve having input and output electrodes, a transformer having a primary winding and a plurality of secondary windings, said primary winding being connected in series with said output electrodes, a condenser, circuit means connecting said condenser across said input electrodes, means for charging said condenser so that the voltage across said condenser builds up linearly, and a second electron discharge valve having discharge electrodes connected in series with one of said secondary windings across said condenser for discharging the same when the current in said transformer reaches a predetermined value so that a sawtooth voltage wave is applied to said input electrodes and the current in said output electrodes is of a corresponding sawtooth wave form, a different one of said secondary windings being connected to said load to apply said sawtooth current wave thereto.

6. An oscillator for providing current of sawtooth wave form in an inductive load comprising an electron discharge valve having input and output electrodes, an output circuit including a transformer having a primary winding and a plurality of secondary windings, said primary winding being connected in series with said output electrodes, a condenser, circuit means connecting said condenser across said input electrodes, means for charging said condenser so that the voltage across said condenser builds up linearly, discharge means coupled to said output circuit and connected across said condenser for discharging said condenser when the current in said transformer reaches a predetermined value so that a sawtooth voltage wave is applied to said input electrodes and the current in said output electrodes is of sawtooth wave form, one of said secondary windings being connected to said load for applying said sawtooth current wave thereto, and means for applying operating potential to said electron discharge valve including a second condenser and a rectifier connected in series with another one of said secondary windings for charging said second condenser from the energy released by said transformer and said load when the current therein decreases.

7. An oscillator for providing current of sawtooth wave form in an inductive load comprising an electron discharge valve having input and output electrodes, a transformer having a primary winding and at least three secondary windings, said primary winding being connected in series with said output electrodes, a condenser, circuit means connecting said condenser across said input electrodes, means for charging said condenser so that the voltage across said condenser builds up linearly, means including a discharge tube having electrodes connected in series with one of said secondary windings across said condenser for discharging said condenser when the current in said transformer reaches a predetermined value so that a sawtooth voltage wave is applied to said input electrodes and the current in said output electrodes is of sawtooth wave form, the second secondary winding being connected to said load to apply said sawtooth current wave thereto, and means for applying operating potential to said electron discharge valve including a second condenser and a rectifier connected in series with the third secondary winding for charging said second condenser from the energy released by said transformer and said load when the current therein decreases.

8. An oscillator for providing current of sawtooth wave form in an inductive load comprising an electron discharge valve having input and output electrodes, a transformer having a primary winding and a pair of secondary windings, said primary winding being connected in series with said output electrodes, a condenser, means for charging said condenser so that the voltage builds up linearly thereacross, means connecting said condenser across said input electrodes of said valve for applying said voltage on said condenser to said input electrodes, means providing operating potential to said discharge valve so that the output current thereof builds up linearly corresponding to said input voltage until a predetermined voltage is reached when said output current decreases its rate of rise and a voltage pulse is produced across said output electrodes of said valve, means including a discharge tube having electrodes connected in series with one of said secondary windings across said condenser for discharging said condenser when said voltage pulse is produced so that a sawtooth voltage wave is applied to said input electrodes and the output current of said valve is of sawtooth wave form, the other one of said secondary windings being connected to said load and applying said sawtooth current wave thereto.

9. An oscillator for providing current of sawtooth wave form in an inductive load comprising first and second electron discharge valves each having at least a cathode, a grid and a plate, said cathodes of said valves being grounded so that said valves can be enclosed in a single envelope, a transformer having primary and secondary windings, an output circuit for coupling said load to said first valve including said primary winding connected in series with the plate and cathode of said first valve, a condenser, circuit means connecting said condenser across said cathode and said grid of said first valve, means for charging said condenser so that the voltage builds up linearly thereacross, means providing operating potential to said first discharge valve so that the output current thereof corresponds to the voltage impressed on said grid until a predetermined value is reached with said output current thereafter decreasing its rate of rise so that a voltage pulse is produced on said plate of said valve, said plate and cathode of said second valve being connected in series with said secondary winding across said condenser so that said voltage pulse is transmitted through said transformer to said second electron discharge valve to render the same conducting and thereby discharge said condenser so that the voltage across said condenser is of sawtooth wave form and the current applied to said load is also of sawtooth wave form.

10. An oscillator for providing current of sawtooth wave form which is held in step with synchronization pulses comprising, first and second electron discharge valves having input and output electrodes, a transformer having primary and secondary windings, an output circuit for said first valve including said primary winding connected in series with said output electrodes of said first valve, a condenser, circuit means connecting said condenser across said input electrodes of said first valve, means for charging said condenser so that the voltage builds up linearly thereacross, means providing operating potential to said first discharge valve so that the output current thereof corresponds to said input voltage until a predetermined value is reached with said output current thereafter decreasing its rate of rise so that a voltage pulse is produced in said output circuit of said valve, said output electrodes of said second valve being connected in series with said secondary winding across said condenser so that said voltage pulse is applied to said output electrodes of said second electron discharge valve, and means for applying said synchronization pulses to said input circuit of said second electron discharge valve for rendering said valve conducting so that said voltage wave developed across said condenser is held in step with said synchronization pulses.

11. An oscillator for providing current of sawtooth wave form in an inductive load in which said current wave is held in step with synchronization pulses comprising, an electron discharge valve having input and output electrodes, an output circuit connected to said output electrodes for coupling said load thereto, a condenser, circuit means connecting said condenser across said input electrodes, means for charging said condenser so that the voltage builds up linearly thereacross, means providing operating potential to said discharge valve so that the output current thereof corresponds to said input voltage until a predetermined value is reached with said output current thereafter decreasing its rate of rise so that a voltage pulse is produced in said output circuit of said valve, and means for discharging said condenser including a second electron discharge valve including input and output electrodes, said input electrodes of said second electron discharge valve being adapted to receive said synchronization pulses, a circuit coupled to said output circuit for connecting said output electrodes of said second electron discharge valve across said condenser, said second electron discharge valve being rendered conducting to discharge said condenser when synchronization pulses are applied thereto and when voltage pulses are produced in said output circuits.

KURT SCHLESINGER.

REFERENCES CITED

The following references are of record in the file of this patent:

UNITED STATES PATENTS

| Number | Name | Date |
|---|---|---|
| 2,093,177 | Vance | Sept. 14, 1937 |
| 2,125,732 | Bowman-Manifold et al. | Aug. 2, 1938 |
| 2,143,366 | Andrieu | Jan. 10, 1939 |
| 2,161,948 | Bull et al. | June 13, 1939 |
| 2,254,031 | Faudell | Aug. 26, 1941 |
| 2,458,532 | Schlesinger | Jan. 11, 1949 |